US012647098B2

(12) United States Patent
    Kishimoto

(10) Patent No.: US 12,647,098 B2
(45) Date of Patent: Jun. 2, 2026

(54) PIEZOELECTRIC DEVICE

(71) Applicant: Murata Manufacturing Co., Ltd.,
              Nagaokakyo (JP)

(72) Inventor: Yutaka Kishimoto, Nagaokakyo (JP)

(73) Assignee: **MURATA MANUFACTURING CO.,
              LTD.**, Kyoto (JP)

( * ) Notice: Subject to any disclaimer, the term of this
             patent is extended or adjusted under 35
             U.S.C. 154(b) by 887 days.

(21) Appl. No.: 17/965,867

(22) Filed: Oct. 14, 2022

(65) Prior Publication Data

US 2023/0043420 A1     Feb. 9, 2023

Related U.S. Application Data

(63) Continuation of application No.
     PCT/JP2021/015375, filed on Apr. 14, 2021.

(30) Foreign Application Priority Data

Apr. 16, 2020    (JP) ................................. 2020-073696

(51) Int. Cl.
     *H03H 9/17*         (2006.01)
     *H03H 3/02*         (2006.01)
                  (Continued)
(52) U.S. Cl.
     CPC .............. *H03H 9/173* (2013.01); *H03H 3/02*
          (2013.01); *H03H 9/02133* (2013.01); *H03H
          9/132* (2013.01); *H03H 2003/021* (2013.01)
(58) Field of Classification Search
     CPC .... H03H 9/02133; H03H 9/173; H03H 9/564;
                        H03H 9/02023; H03H 9/02039;
                  (Continued)

(56) References Cited

U.S. PATENT DOCUMENTS

2007/0200458 A1     8/2007  Yoshino et al.
2017/0358730 A1*   12/2017  Kishimoto ........... H10N 30/871
                       (Continued)

FOREIGN PATENT DOCUMENTS

EP     1104099 A1    5/2001
EP     1104099 A9 *  8/2001    ........... H03H 9/1035
                       (Continued)

OTHER PUBLICATIONS

International Search Report in PCT/JP2021/015375, mailed Jul. 13,
2021, 3 pages.
                       (Continued)

*Primary Examiner* — J. San Martin
(74) *Attorney, Agent, or Firm* — Keating & Bennett, LLP

(57) ABSTRACT

A single crystal piezoelectric layer includes a first recess in
a first opposing surface opposing a first main surface of a
base. The single crystal piezoelectric layer is bonded to the
first main surface of the base at a portion of the first opposing
surface other than the first recess. A lower electrode layer
defining at least a portion of a pair of electrode layers and
extending over a surface of the single crystal piezoelectric
layer opposing the base is at least partially located in the first
recess. A second opposing surface of the lower electrode
layer opposing the first main surface of the base has surface
roughness greater than the surface roughness of the first
opposing surface of the single crystal piezoelectric layer.

17 Claims, 6 Drawing Sheets

(51) Int. Cl.
    *H03H 9/02*         (2006.01)
    *H03H 9/13*         (2006.01)

(58) Field of Classification Search
    CPC ........... H03H 9/02055; H03H 9/02031; H03H
               2003/021; H03H 3/02; H03H 9/132;
               H03H 9/02015; H10N 30/87; H10N
                      30/06; H10N 30/853
    See application file for complete search history.

(56)              References Cited

U.S. PATENT DOCUMENTS

| 2022/0209098 A1* | 6/2022 | Kishimoto | ......... H10N 30/2047 |
| 2022/0384708 A1* | 12/2022 | Kishimoto | .......... H10N 30/072 |

FOREIGN PATENT DOCUMENTS

| JP | 2007228356 A | 9/2007 |
| JP | 2013179405 A | 9/2013 |
| WO | 0076066 A1 | 12/2000 |

OTHER PUBLICATIONS

Written Opinion in PCT/JP2021/015375, mailed Jul. 13, 2021, 4 pages.
Tai et al., "Single crystal FBAR with LiNbO3 and LiTaO3," Proceedings of Symposium on Ultrasonic Electronics, vol. 28, 2007, pp. 151-152.

* cited by examiner

PIEZOELECTRIC DEVICE

CROSS REFERENCE TO RELATED APPLICATIONS

This application claims the benefit of priority to Japanese Patent Application No. 2020-073696, filed on Apr. 16, 2020, and is a Continuation Application of PCT Application No. PCT/JP2021/015375, filed on Apr. 14, 2021. The entire contents of each application are hereby incorporated herein by reference.

BACKGROUND OF THE INVENTION

1. Field of the Invention

The present invention relates to a piezoelectric device.

2. Description of the Related Art

Examples of a document disclosing a structure of a piezoelectric device include "Single crystal FBAR with $LiNbO_3$ and $LiTaO_3$", Proceedings of Symposium on Ultrasonic Electronics, Vol. 28, (2007), pp. 151-152. The piezoelectric device described in "Single crystal FBAR with $LiNbO_3$ and $LiTaO_3$", Proceedings of Symposium on Ultrasonic Electronics, Vol. 28, (2007), pp. 151-152 has a space between a primary substrate and a lower electrode layer included in a piezoelectric layer.

The piezoelectric device described in "Single crystal FBAR with $LiNbO_3$ and $LiTaO_3$", Proceedings of Symposium on Ultrasonic Electronics, Vol. 28, (2007), pp. 151-152 has unstable excitation characteristics when the lower electrode layer and the primary substrate are bonded at excitation of the piezoelectric device.

SUMMARY OF THE INVENTION

Preferred embodiments of the present invention provide piezoelectric devices each having stable excitation characteristics.

A piezoelectric device according to a preferred embodiment of the present invention includes a base and a laminated portion. The base includes a first main surface and a second main surface opposed to the first main surface. The laminated portion is laminated on the first main surface of the base. The laminated portion includes a single crystal piezoelectric layer and a pair of electrode layers that apply a voltage to the single crystal piezoelectric layer. The single crystal piezoelectric layer includes a first recess in a first opposing surface that opposes the first main surface of the base. The single crystal piezoelectric layer is bonded to the first main surface of the base at a portion of the first opposing surface other than the first recess. A lower electrode layer defining at least a portion of the pair of electrode layers and extending along a surface of the single crystal piezoelectric layer opposing the base is at least partially located in the first recess. A second opposing surface of the lower electrode layer opposing the first main surface of the base has a surface roughness (Ra) greater than a surface roughness (Ra) of the first opposing surface of the single crystal piezoelectric layer.

According to preferred embodiments of the present invention, piezoelectric devices each having stable excitation characteristics are provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Piezoelectric devices according to preferred embodiments of the present invention will be described below with reference to the drawings. In the following description of the preferred embodiments, the same or corresponding portions throughout the drawings are denoted with the same reference signs without being repeatedly described.

First Preferred Embodiment

Figure 1:
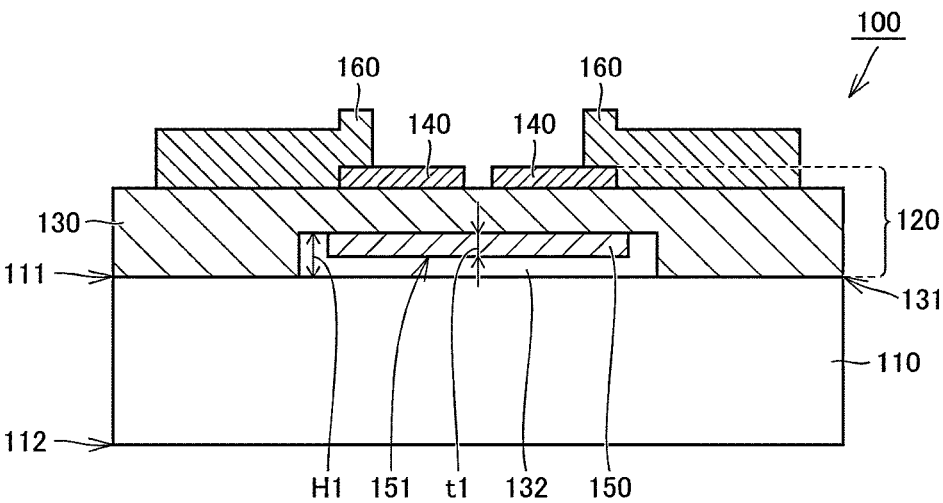
FIG. 1 is a cross-sectional view of a structure of a piezoelectric device according to a first preferred embodiment of the present invention.

FIG. 1 is a cross-sectional view of a structure of a piezoelectric device according to a first preferred embodiment of the present invention. As illustrated in FIG. 1, a piezoelectric device 100 according to the first preferred embodiment of the present invention includes a base 110 and a laminated portion 120.

The base 110 includes a first main surface 111, and a second main surface 112 opposed to the first main surface 111. In the present preferred embodiment, the base 110 is preferably made from Si. However, the material forming the base 110 is not limited to Si and can instead be made of any desirable material.

The laminated portion 120 is laminated on the first main surface 111 of the base 110. The laminated portion 120 includes a single crystal piezoelectric layer 130 and a pair of electrode layers. The pair of electrode layers apply a voltage to the single crystal piezoelectric layer 130. In the present preferred embodiment, the pair of electrode layers include upper electrode layers 140 and a lower electrode layer 150.

Figure 16:
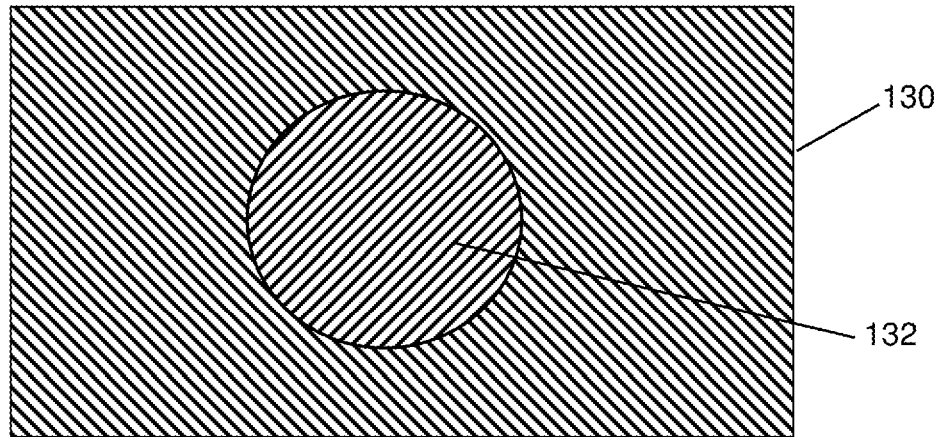
FIG. 16 is a plan view of the single crystal piezoelectric layer including a first recess according to the first preferred embodiment of the present invention.

The single crystal piezoelectric layer 130 is located above the base 110. In the present preferred embodiment, the single crystal piezoelectric layer 130 is located on the first main surface 111 of the base 110. The single crystal piezoelectric layer 130 includes a first recess 132 in a first opposing surface 131 opposing the first main surface 111 of the base 110. In the present preferred embodiment, when viewed in a direction perpendicular to the first opposing surface 131, the first recess 132 has a circular or substantially circular profile (see FIG. 16), but may have a profile with another shape such as an elliptical or polygonal shape, for example. The single crystal piezoelectric layer 130 is bonded to the first main surface 111 of the base 110 at a portion of the first opposing surface 131 other than the first recess 132.

In the present preferred embodiment, the first recess 132 is preferably an enclosed space. In the piezoelectric device 100 according to the present preferred embodiment, the pressure inside the first recess 132 is a negative pressure. Instead, the pressure inside the first recess 132 may be an atmospheric pressure or a positive pressure.

The single crystal piezoelectric layer 130 is preferably made of, for example, lithium tantalate or lithium niobate. The single crystal piezoelectric layer 130 made of lithium tantalate or lithium niobate has uniform or substantially uniform polarization. The single crystal piezoelectric layer 130 may be made from crystal, for example.

Figure 17:
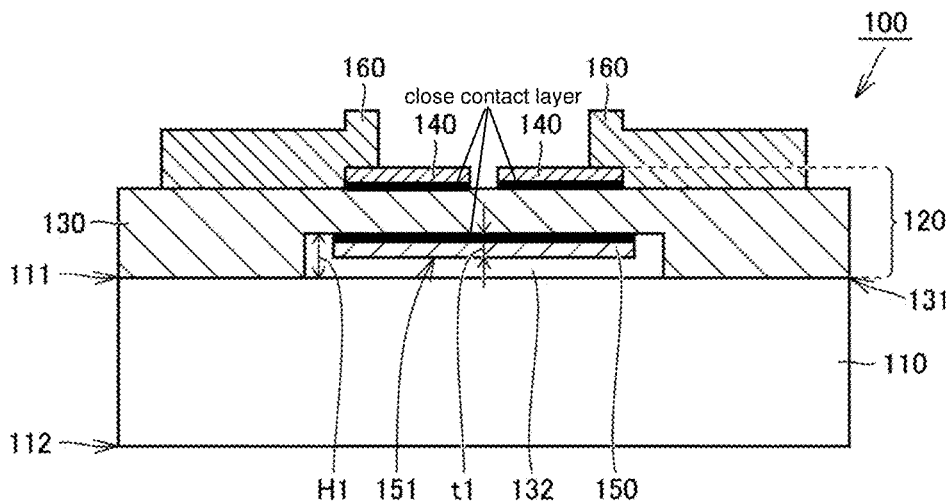
FIG. 17 is a cross-sectional view of a structure of a piezoelectric device according to a modification of the first preferred embodiment of the present invention.

The upper electrode layers 140 are on the single crystal piezoelectric layer 130. In the present preferred embodiment, the upper electrode layers 140 are on a portion of the single crystal piezoelectric layer 130. A close contact layer made of, for example, Ti, Cr, Ni, or NiCr may be disposed between the upper electrode layers 140 and the single crystal piezoelectric layer 130 (see FIG. 17). The upper electrode layers 140 are preferably made of, for example, a metal such as Al, Pt, Mo, or W.

At least a portion of the upper electrode layers 140 is above the first recess 132. In the present preferred embodiment, the paired upper electrode layers 140 are above the first recess 132 at a distance from each other.

The paired upper electrode layers 140 are respectively connected to first extended wires 160. The first extended wires 160 are preferably made from, for example, a metal such as Au, Pt, or Al. Close contact layers may be disposed between the first extended wires 160 and the upper electrode layers 140. The close contact layers are made from, for example, Ti, Cr, Ni, or NiCr. The first extended wires 160 and the upper electrode layers 140 are in ohmic contact with each other.

The lower electrode layer 150 is positioned to at least partially oppose the pair of upper electrode layers 140 with the single crystal piezoelectric layer 130 interposed therebetween. In the present preferred embodiment, the lower electrode layer 150 defines a portion of the pair of electrode layers. The upper electrode layers 140 are electrically connected to each other through the lower electrode layer 150.

The lower electrode layer 150 extends over the surface of the single crystal piezoelectric layer 130 opposing the base 110. More specifically, the lower electrode layer 150 extends over the bottom surface of the first recess 132 in the single crystal piezoelectric layer 130. In the present preferred embodiment, the lower electrode layer 150 is located only inside the first recess 132. Instead of being located only inside the first recess 132, the lower electrode layer 150 may be located at any portion as long as being at least partially located inside the first recess 132. The lower electrode layer 150 is preferably made from, for example, a metal such as Al, Pt, Mo, or W.

As illustrated in FIG. 1, a thickness t1 of the lower electrode layer 150 is preferably smaller than or equal to a depth H1 of the first recess 132. To more effectively stabilize the excitation characteristics of the piezoelectric device 100, the thickness t1 of the lower electrode layer 150 is preferably smaller than the depth H1 of the first recess 132.

A second opposing surface 151 of the lower electrode layer 150 opposing the first main surface 111 of the base 110 has surface roughness (Ra) greater than the surface roughness (Ra) of the first opposing surface 131 of the single crystal piezoelectric layer 130. The surface roughness (Ra) is arithmetic mean roughness (JIS B 0601). In the present preferred embodiment, the surface roughness (Ra) of the second opposing surface 151 of the lower electrode layer 150 is greater than or equal to about 0.5 nm and smaller than or equal to about 5.0 nm, for example.

A non-limiting example of a method of manufacturing the piezoelectric device 100 according to the first preferred embodiment of the present invention will be described below.

Figure 2:
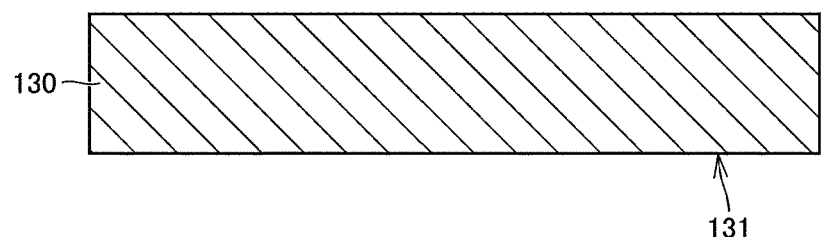
FIG. 2 is a cross-sectional view of a single crystal piezoelectric layer not including a first recess formed with a method of manufacturing a piezoelectric device according to the first preferred embodiment of the present invention.
Figure 3:
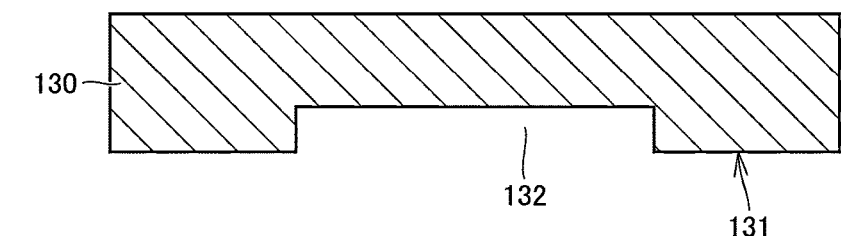
FIG. 3 is a cross-sectional view of a single crystal piezoelectric layer including a first recess formed with the method of manufacturing a piezoelectric device according to the first preferred embodiment of the present invention.

FIG. 2 is a cross-sectional view of a single crystal piezoelectric layer not yet having a first recess formed with a method of manufacturing a piezoelectric device according to the first preferred embodiment of the present invention. FIG. 3 is a cross-sectional view of a single crystal piezoelectric layer having a first recess formed with the method of manufacturing a piezoelectric device according to the first preferred embodiment of the present invention.

The single crystal piezoelectric layer 130 formed as illustrated in FIG. 2 has a thickness greater than a thickness of the single crystal piezoelectric layer 130 finally included in the piezoelectric device 100 according to the present preferred embodiment.

As illustrated in FIG. 3, the first recess 132 is preferably formed in the single crystal piezoelectric layer 130 by performing, for example, reactive ion etching (RIE) on the single crystal piezoelectric layer 130 at the first opposing surface 131 of the single crystal piezoelectric layer 130.

Figure 4:
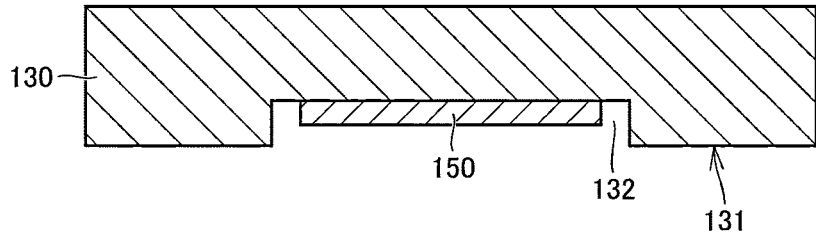
FIG. 4 is a cross-sectional view of a lower electrode layer in the first recess formed in the single crystal piezoelectric layer with the method of manufacturing a piezoelectric device according to the first preferred embodiment of the present invention.

FIG. 4 is a cross-sectional view of a lower electrode layer provided in a first recess in the single crystal piezoelectric layer with the method of manufacturing a piezoelectric device according to the first preferred embodiment of the present invention. As illustrated in FIG. 4, the lower elec- trode layer 150 is disposed in the first recess 132 in the single crystal piezoelectric layer 130 through, for example, lift-off, plating, or etching.

Figure 5:
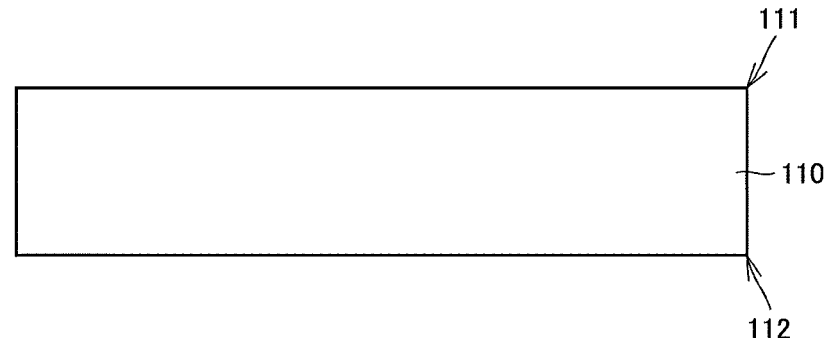
FIG. 5 is a cross-sectional view of a base that has not yet bonded to the single crystal piezoelectric layer with the method of manufacturing a piezoelectric device according to the first preferred embodiment of the present invention.
Figure 6:
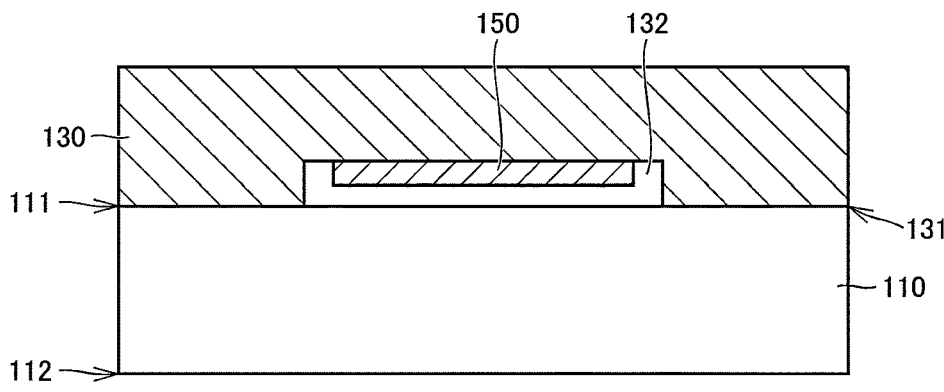
FIG. 6 is a cross-sectional view of a first opposing surface of the single crystal piezoelectric layer and a first main surface of the base bonded together with the method of manufacturing a piezoelectric device according to the first preferred embodiment of the present invention.

FIG. 5 is a cross-sectional view of a base that has not yet been bonded to the single crystal piezoelectric layer with the method of manufacturing a piezoelectric device according to the first preferred embodiment of the present invention. FIG. 6 is a cross-sectional view of the single crystal piezoelectric layer and the base where the first opposing surface of the single crystal piezoelectric layer and the first main surface of the base are bonded to each other with the method of manufacturing a piezoelectric device according to the first preferred embodiment of the present invention.

As illustrated in FIG. 5 and FIG. 6, through surface activated bonding, atomic diffusion bonding, or another method, the first opposing surface 131 of the single crystal piezoelectric layer 130 and the first main surface 111 of the base 110 are bonded to each other. A bonding layer prefer- ably made of, for example, Ti may be interposed between bonded surfaces. Thus, the first recess 132 is formed as an enclosed space.

In the present preferred embodiment, to prevent intrusion of impurities into the first recess 132, the single crystal piezoelectric layer 130 and the base 110 are bonded to each other under vacuum pressure. In this case, the vacuum pressure may be any of low vacuum, medium vacuum, high vacuum, and ultra-high vacuum. The single crystal piezo- electric layer 130 and the base 110 are bonded to each other in the above manner, and thus the pressure inside the first recess 132 is a negative pressure.

The atmosphere under which the single crystal piezoelec- tric layer 130 and the base 110 are bonded to each other is not limited to the atmosphere under vacuum pressure. The single crystal piezoelectric layer 130 may be bonded to the base 110 under the atmospheric pressure or under a pressure higher than the atmospheric pressure.

Figure 7:
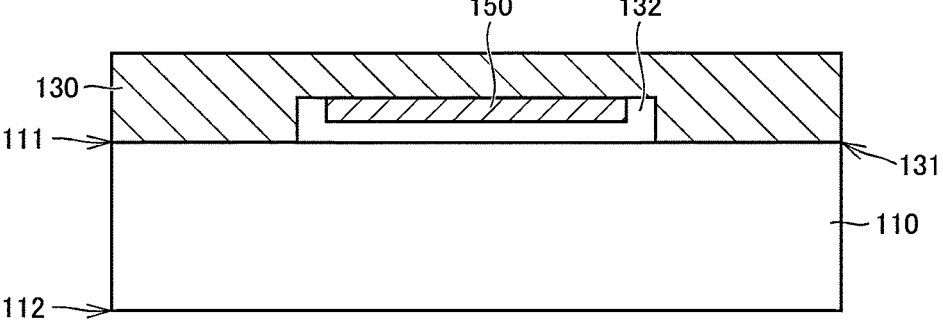
FIG. 7 is a cross-sectional view of an upper surface of the single crystal piezoelectric layer planed with the method of manufacturing a piezoelectric device according to the first preferred embodiment of the present invention.

FIG. 7 is a cross-sectional view of the single crystal piezoelectric layer including the upper surface planed with the method of manufacturing a piezoelectric device accord- ing to the first preferred embodiment of the present inven- tion. As illustrated in FIG. 7, the upper surface of the single crystal piezoelectric layer 130 is preferably planed through, for example, chemical mechanical polishing (CMP) to define the single crystal piezoelectric layer 130 with a desired thickness. In this case, the thickness of the single crystal piezoelectric layer 130 is adjusted to have a desired expansion/contraction amount of the single crystal piezo- electric layer 130 through an application of the voltage.

A release layer may be formed by preliminarily perform- ing ion implantation on the upper surface of the single crystal piezoelectric layer 130. In this case, the release layer is released before the upper surface of the single crystal piezoelectric layer 130 is planed through, for example, CMP to facilitate thickness adjustment of the single crystal piezo- electric layer 130.

As illustrated in FIG. 1, the upper electrode layers 140 are provided on a portion of the upper surface of the single crystal piezoelectric layer 130 through, for example, lift-off, plating, or etching. Thus, the laminated portion 120 is laminated on the first main surface 111 of the base 110. In addition, the first extended wires 160 are formed by photo- lithography or lift-off to be connected to the upper surface of the upper electrode layers 140.

With the above processes, the piezoelectric device 100 according to the first preferred embodiment of the present invention illustrated in FIG. 1 is manufactured.

As described above, in the piezoelectric device 100 according to the present preferred embodiment, the second opposing surface 151 of the lower electrode layer 150 opposing the first main surface 111 of the base 110 has surface roughness (Ra) greater than the surface roughness (Ra) of the first opposing surface 131 of the single crystal piezoelectric layer 130. Thus, if the second opposing surface 151 of the lower electrode layer 150 and the first main surface 111 of the base 110 are bonded to each other at excitation of the piezoelectric device 100, the bonding strength can be reduced. The piezoelectric device 100 with this structure can avoid having unstable excitation charac- teristics due to bonding of the second opposing surface 151 of the lower electrode layer 150 and the first main surface 111 of the base 110 to each other. More specifically, the piezoelectric device 100 has stable excitation characteristics.

In the piezoelectric device 100 according to the present preferred embodiment, the surface roughness (Ra) of the second opposing surface 151 of the lower electrode layer 150 is preferably greater than or equal to about 0.5 nm and smaller than or equal to about 5.0 nm, for example. Thus, the second opposing surface 151 of the lower electrode layer 150 and the first main surface 111 of the base 110 are less easily bonded to each other. Thus, the piezoelectric device 100 has more stable excitation characteristics.

In the piezoelectric device 100 according to the present preferred embodiment, the lower electrode layer 150 is located only inside the first recess 132. This structure eliminates highly accurate positioning between the single crystal piezoelectric layer 130 and the base 110 to bond the single crystal piezoelectric layer 130 and the base 110 to each other. This structure thus facilitates bonding of the single crystal piezoelectric layer 130 and the base 110 to each other. When the single crystal piezoelectric layer 130 vibrates with a voltage applied by the upper electrode layers 140 and the lower electrode layer 150, this structure can reduce or prevent attenuation of vibrations propagating to the periphery of the piezoelectric device 100 through the lower electrode layer 150. Thus, the piezoelectric device 100 has higher excitation efficiency.

In the piezoelectric device 100 according to the present preferred embodiment, the thickness t1 of the lower elec- trode layer 150 is smaller than or equal to the depth H1 of the first recess 132. Thus, regardless of when the first main surface 111 of the base 110 is a flat surface without a recess, the lower electrode layer 150 can be accommodated in the first recess 132. The piezoelectric device 100 thus has a simple structure.

Second Preferred Embodiment

A piezoelectric device according to a second preferred embodiment of the present invention will be described below with reference to the drawings. The piezoelectric device according to the second preferred embodiment of the present invention preferably mainly differs from the piezoelectric device 100 according to the first preferred embodiment of the present invention in that the piezoelectric device according to the second preferred embodiment has a second recess provided in the first main surface of the base and the lower electrode layer is in contact with the base. The components the same or substantially the same as those of the piezoelectric device 100 according to the first preferred embodiment of the present invention will not be redundantly described.

Figure 8:
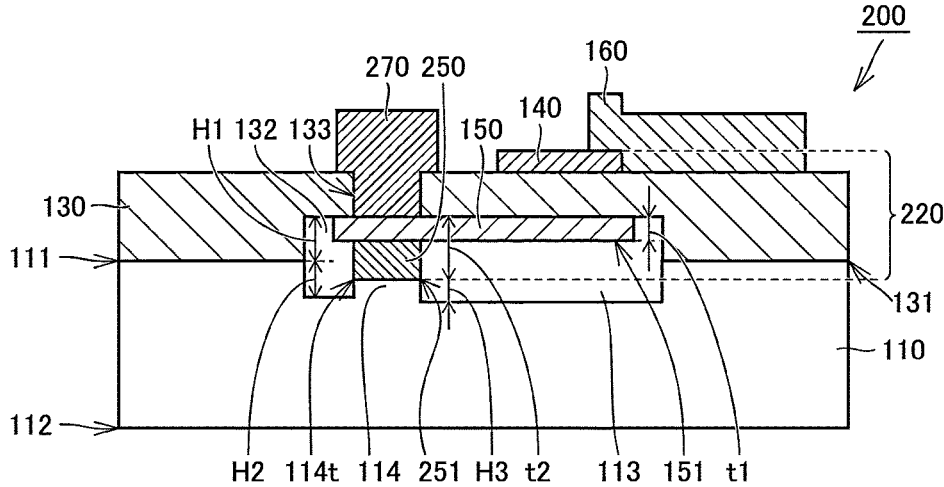
FIG. 8 is a cross-sectional view of a structure of a piezoelectric device according to a second preferred embodiment of the present invention.

FIG. 8 is a cross-sectional view of a structure of the piezoelectric device according to the second preferred embodiment of the present invention. As illustrated in FIG. 8, a piezoelectric device 200 according to the second preferred embodiment of the present invention includes the base 110 and a laminated portion 220.

In the present preferred embodiment, a second recess 113 is defined in the first main surface 111 of the base 110 at a position opposing the first recess 132. When viewed in a direction perpendicular to the first main surface 111, the second recess 113 has a circular or substantially circular profile, but may have a profile with another shape such as an elliptical or polygonal shape, for example.

As illustrated in FIG. 8, the second recess 113 is covered from above with the laminated portion 220 laminated on the first main surface 111 of the base 110. In the present preferred embodiment, the first recess 132 and the second recess 113 define an enclosed space.

In the piezoelectric device 200 according to the present preferred embodiment, the pressure inside the first recess 132 and the second recess 113 is a negative pressure. Instead, the pressure inside the first recess 132 and the second recess 113 may be an atmospheric pressure or a positive pressure.

In the present preferred embodiment, the single crystal piezoelectric layer 130 preferably includes, at a portion above the lower electrode layer 150, a hole 133 extending through the single crystal piezoelectric layer 130 from the upper surface opposite to the first opposing surface 131 to the bottom surface of the first recess 132.

A portion of the lower electrode layer 150 is located below the hole 133 defined in the single crystal piezoelectric layer 130. In the present preferred embodiment, the lower electrode layer 150 is positioned to cover, from below, the hole 133 in the single crystal piezoelectric layer 130.

As illustrated in FIG. 8, a second extended wire 270 electrically connected to the lower electrode layer 150 is located through the hole 133. More specifically, the second extended wire 270 is connected to the upper surface of the lower electrode layer 150 in the hole 133, and extended through the hole 133 over the upper surface of the single crystal piezoelectric layer 130 opposite to the surface opposing the base 110.

The second extended wire 270 is preferably made of, for example, a metal such as Au, Pt, or Al. A close contact layer may be disposed between the second extended wire 270 and the lower electrode layer 150. The close contact layer is made of, for example, Ti, Cr, Ni, or NiCr. The second extended wire 270 and the lower electrode layer 150 are in ohmic contact with each other.

The lower electrode layer 150 may be positioned to cover the lower side of the hole 133 in the single crystal piezoelectric layer 130 with the close contact layer interposed therebetween. The close contact layer may be made of any material with electroconductivity and adhesion. The close contact layer is made of, for example, Ti, Cr, Ni, or NiCr.

In the present preferred embodiment, the base 110 preferably includes a protrusion 114 protruding from the bottom of the second recess 113 into the second recess 113. The protrusion 114 may be eliminated. As illustrated in FIG. 8, the second recess 113 has a depth H2, and the protrusion 114 has a height H3 from the bottom of the second recess 113, and the relationship H3<H2 is satisfied.

The protrusion 114 preferably has a cylindrical or substantially cylindrical shape. Instead of a cylindrical shape, the protrusion 114 may have another shape such as a prismatic shape, for example.

When viewed in the direction perpendicular or substantially perpendicular to the first main surface 111, the entirety or substantially the entirety of the inside of the hole 133 overlaps an upper surface 114t of the protrusion 114. When viewed in the direction perpendicular or substantially perpendicular to the first main surface 111, the internal area of the hole 133 is smaller than or equal to the area of the upper surface 114t of the protrusion 114.

In the present preferred embodiment, a reinforcing lower electrode layer 250 is located between the lower electrode layer 150 and the upper surface 114t of the protrusion 114. The reinforcing lower electrode layer 250 is neither necessarily electroconductive, nor made of metal.

As illustrated in FIG. 8, the lower electrode layer 150 preferably has a thickness t1 at a portion at which a voltage is applied to the single crystal piezoelectric layer 130, the thickness obtained by adding the thickness of the lower electrode layer 150 and the thickness of the reinforcing lower electrode layer 250 at a portion located between the upper surface 114t of the protrusion 114 and the hole 133 is t2, and the relationship of t2>t1 is satisfied.

Specifically, the lower electrode layer including the lower electrode layer 150 and the reinforcing lower electrode layer 250 at the portion located between the upper surface 114t of the protrusion 114 and the hole 133 is thicker than the portion of the single crystal piezoelectric layer 130 to which a voltage is applied.

The upper surface 114t of the protrusion 114 is in contact with the lower electrode layer. In the present preferred embodiment, the upper surface 114t of the protrusion 114 is in contact with the reinforcing lower electrode layer 250.

As described above, in the present preferred embodiment, the lower electrode layer including the lower electrode layer 150 and the reinforcing lower electrode layer 250 includes an area that has the thickness t2 greater than the depth H1 of the first recess 132, and that is in contact with the protrusion 114 of the base 110 located in the second recess 113.

A second opposing surface 251 of the reinforcing lower electrode layer 250 opposing the upper surface 114t of the protrusion 114 preferably has surface roughness (Ra) greater than the surface roughness (Ra) of the first opposing surface 131 of the single crystal piezoelectric layer 130. In the present preferred embodiment, the surface roughness (Ra) of the second opposing surface 251 of the reinforcing lower electrode layer 250 is greater than or equal to about 0.5 nm and smaller than or equal to about 5.0 nm, for example.

Hereinbelow, a non-limiting example of a method of manufacturing the piezoelectric device 200 according to the second preferred embodiment of the present invention will be described.

The method of manufacturing the piezoelectric device 200 according to the second preferred embodiment of the present invention is the same as the method of manufacturing the piezoelectric device 100 according to the first preferred embodiment of the present invention up to the processes illustrated in FIG. 2 to FIG. 4.

Figure 9:
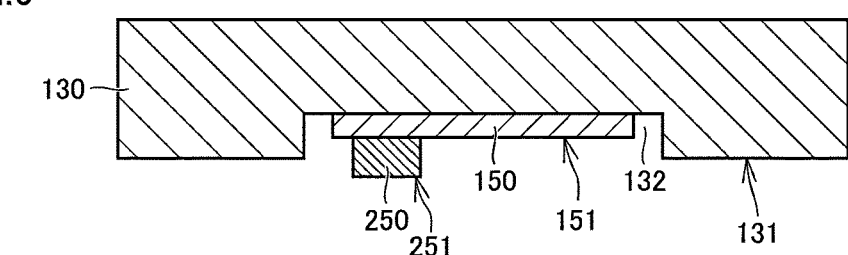
FIG. 9 is a cross-sectional view of a reinforcing lower electrode layer at a portion of a second opposing surface of the lower electrode layer with a method of manufacturing a piezoelectric device according to the second preferred embodiment of the present invention.

FIG. 9 is a cross-sectional view of a reinforcing lower electrode layer disposed at a portion of the second opposing surface of the lower electrode layer with the method of manufacturing a piezoelectric device according to the second preferred embodiment of the present invention. As illustrated in FIG. 9, the reinforcing lower electrode layer 250 is disposed at part of the second opposing surface 151 of the lower electrode layer 150 through, for example, lift-off, plating, or etching.

Figure 10:
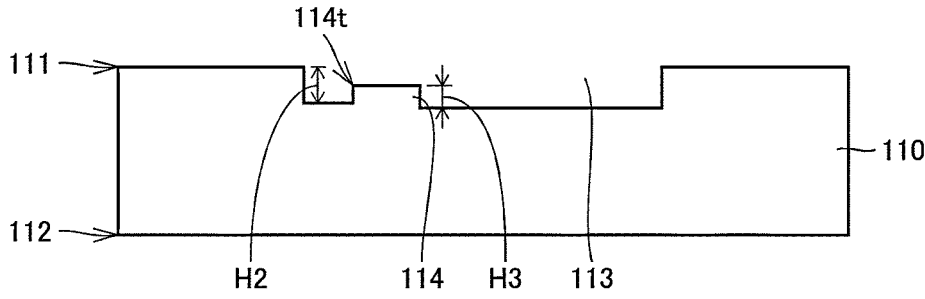
FIG. 10 is a cross-sectional view of a second recess and a protrusion provided at the base with the method of manufacturing a piezoelectric device according to the second preferred embodiment of the present invention.

FIG. 10 is a cross-sectional view of a second recess and a protrusion formed at the base with the method of manufacturing a piezoelectric device according to the second preferred embodiment of the present invention. As illustrated in FIG. 10, the second recess 113 and the protrusion 114 are preferably formed at the base 110 by performing, for example, deep reactive ion etching (DRIE) on the base 110 at the first main surface 111 of the base 110.

Figure 11:
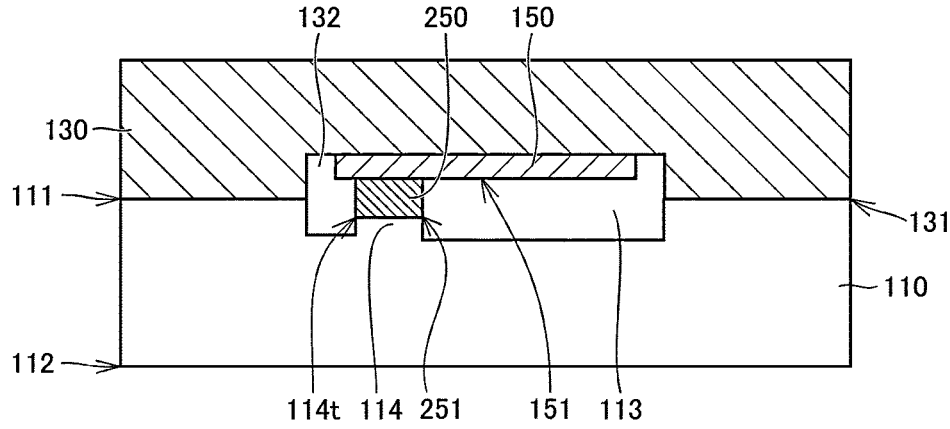
FIG. 11 is a cross-sectional view of a first opposing surface of the single crystal piezoelectric layer and a first main surface of the base bonded together with the method of manufacturing a piezoelectric device according to the second preferred embodiment of the present invention.

FIG. 11 is a cross-sectional view of the single crystal piezoelectric layer and the base where the first opposing surface of the single crystal piezoelectric layer and the first main surface of the base are bonded to each other with the method of manufacturing a piezoelectric device according to the second preferred embodiment of the present invention.

As illustrated in FIG. 11, the first opposing surface 131 of the single crystal piezoelectric layer 130 and the first main surface 111 of the base 110 are bonded to each other through, for example, surface activated bonding or atomic diffusion bonding. A bonding layer made of, for example, Ti may be interposed between the bonded surfaces. Thus, the first recess 132 and the second recess 113 define an enclosed space. At this time, the reinforcing lower electrode layer 250 and the upper surface 114t of the protrusion 114 are in contact with each other.

Figure 12:
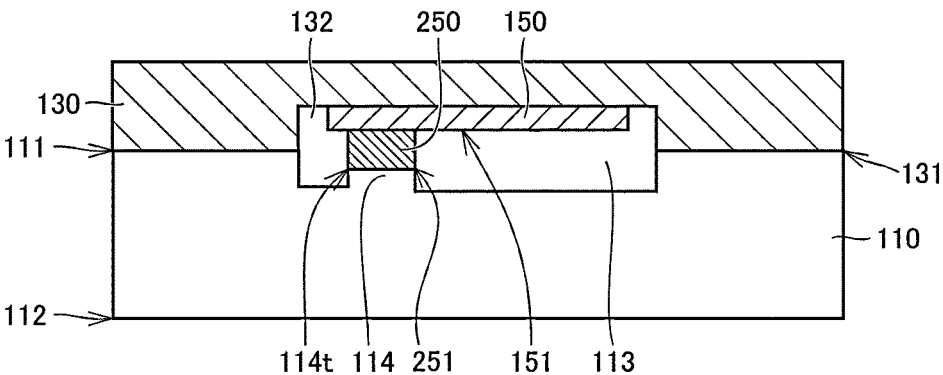
FIG. 12 is a cross-sectional view of an upper surface of the single crystal piezoelectric layer planed with the method of manufacturing a piezoelectric device according to the second preferred embodiment of the present invention.

FIG. 12 is a cross-sectional view of the single crystal piezoelectric layer having the upper surface planed with the method of manufacturing a piezoelectric device according to the second preferred embodiment of the present invention. As illustrated in FIG. 12, the upper surface of the single crystal piezoelectric layer 130 is planed through, for example, CMP to form the single crystal piezoelectric layer 130 with a desired thickness.

Figure 13:
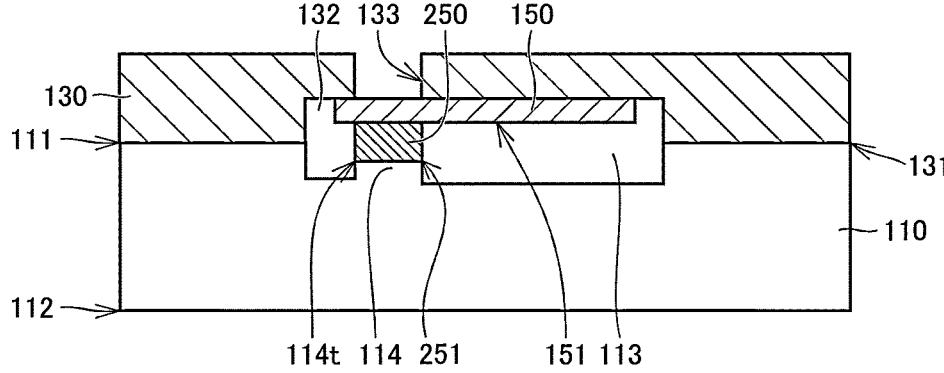
FIG. 13 is a cross-sectional view of a hole defined in the single crystal piezoelectric layer with the method of manufacturing a piezoelectric device according to the second preferred embodiment of the present invention.

FIG. 13 is a cross-sectional view of a hole formed in the single crystal piezoelectric layer with the method of manufacturing a piezoelectric device according to the second preferred embodiment of the present invention. As illustrated in FIG. 13, the hole 133 is formed in the single crystal piezoelectric layer 130 through etching such as RIE.

As illustrated in FIG. 8, the upper electrode layer 140 is preferably formed on a portion of the upper surface of the single crystal piezoelectric layer 130 through, for example, lift-off, plating, or etching. Thus, the laminated portion 220 is laminated on the first main surface 111 of the base 110. A slit that extends through the laminated portion 220 to be continuous with the first recess 132 may be made of, for example, RIE.

In addition, the first extended wire 160 is preferably formed on the upper electrode layer 140 by, for example, photolithography or lift-off to be connected to the upper surface of the base 110.

Finally, the second extended wire 270 is preferably formed by, for example, photolithography or lift-off. With the above processes, the piezoelectric device 200 according to the second preferred embodiment of the present invention illustrated in FIG. 8 is manufactured.

As described above, in the piezoelectric device 200 according to the present preferred embodiment, the second recess 113 is located in the first main surface 111 of the base 110 at a position opposing the first recess 132. The lower electrode layer includes an area that has the thickness t2 greater than the depth H1 of the first recess 132, and that is in contact with the protrusion 114 of the base 110 located in the second recess 113. In this structure, the protrusion 114 supports the laminated portion 220 to prevent the portion of the laminated portion 220 above the first recess 132 from bending toward the second recess 113, and prevents the laminated portion 220 from cracking while the second extended wire 270 is formed.

Third Preferred Embodiment

A piezoelectric device according to a third preferred embodiment of the present invention will be described below with reference to the drawings. The piezoelectric device according to the third preferred embodiment of the present invention mainly differs from the piezoelectric device 200 according to the second preferred embodiment of the present invention in that the piezoelectric device according to the third preferred embodiment eliminates the second recess and the reinforcing lower electrode layer. The components the same or substantially the same as those of the piezoelectric device 200 according to the second preferred embodiment of the present invention will not be repeatedly described.

Figure 14:
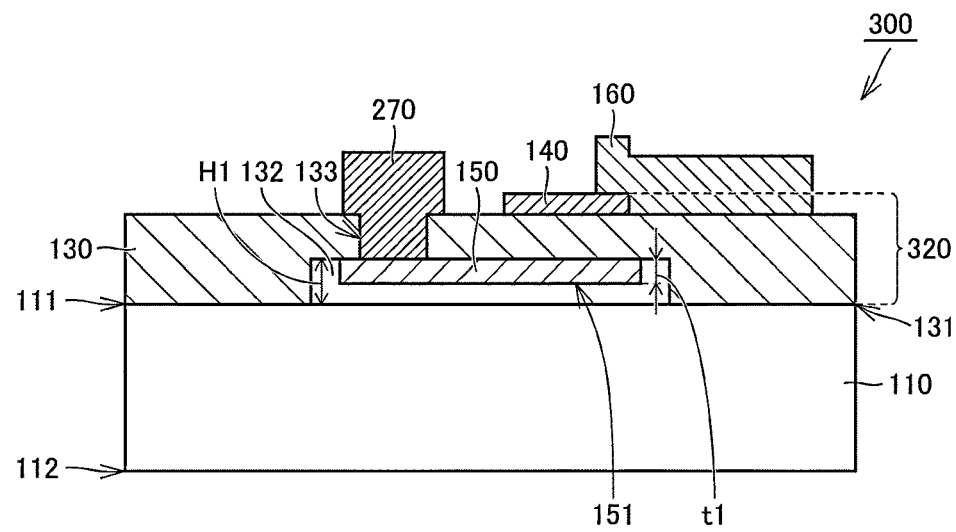
FIG. 14 is a cross-sectional view of a structure of a piezoelectric device according to a third preferred embodiment of the present invention.

FIG. 14 is a cross-sectional view of a structure of a piezoelectric device according to the third preferred embodiment of the present invention. As illustrated in FIG. 14, a piezoelectric device 300 according to the third preferred embodiment of the present invention includes the base 110 and a laminated portion 320.

In the present preferred embodiment, the pair of electrode layers include the upper electrode layer 140 and the lower electrode layer 150. Instead, the pair of electrode layers may only include the lower electrode layer 150. More specifically, the lower electrode layer 150 may include a pair of comb-shaped electrode layers, and the piezoelectric device 300 may apply a voltage to the single crystal piezoelectric layer 130 located between the comb-shaped electrode layers.

In the piezoelectric device 300 according to the present preferred embodiment, the second opposing surface 151 of the lower electrode layer 150 opposing the first main surface 111 of the base 110 has surface roughness (Ra) greater than the surface roughness (Ra) of the first opposing surface 131 of the single crystal piezoelectric layer 130. Thus, if the second opposing surface 151 of the lower electrode layer 150 and the first main surface 111 of the base 110 are bonded to each other as a result of the portion of the laminated portion 320 above the first recess 132 being bent toward the base 110, the bonding strength can be reduced. The piezoelectric device 300 with this structure can avoid having unstable excitation characteristics due to bonding of the second opposing surface 151 of the lower electrode layer 150 and the first main surface 111 of the base 110 to each other. More specifically, the piezoelectric device 300 has stable excitation characteristics.

Fourth Preferred Embodiment

A piezoelectric device according to a fourth preferred embodiment of the present invention will be described below with reference to the drawings. The piezoelectric device according to the fourth preferred embodiment of the present invention mainly differs from the piezoelectric device 100 according to the first preferred embodiment of the present invention in that the piezoelectric device according to the fourth preferred embodiment preferably includes an extended lower electrode. The components the same as those of the piezoelectric device 100 according to the first preferred embodiment of the present invention will not be repeatedly described.

Figure 15:
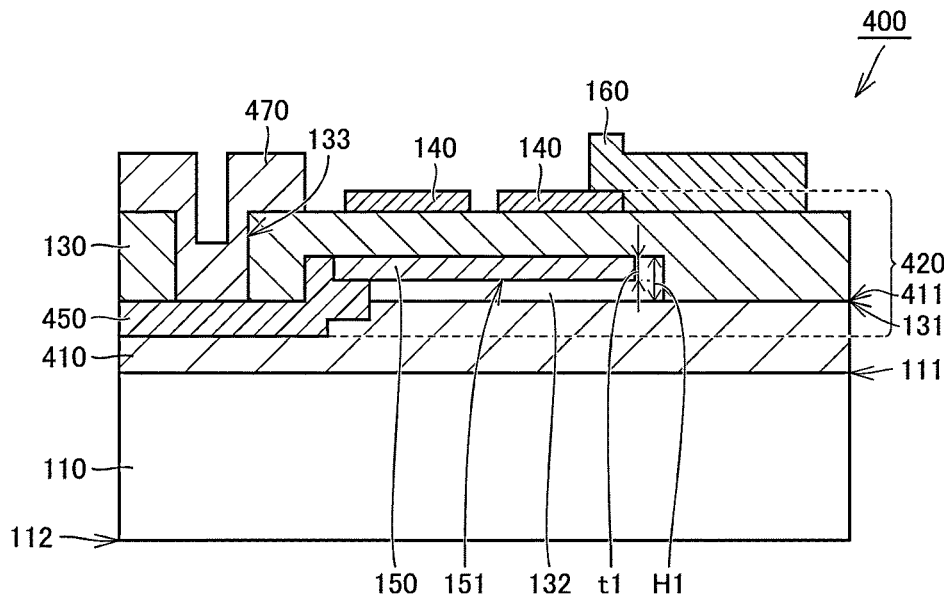
FIG. 15 is a cross-sectional view of a structure of a piezoelectric device according to a fourth preferred embodiment of the present invention.

FIG. 15 is a cross-sectional view of a structure of the piezoelectric device according to the fourth preferred embodiment of the present invention. As illustrated in FIG. 15, a piezoelectric device 400 according to the fourth preferred embodiment of the present invention includes the base 110 and a laminated portion 420. The piezoelectric device 400 also includes an intermediate layer 410 interposed between the base 110 and the laminated portion 420.

The laminated portion 420 is laminated on the first main surface 111 of the base 110 with the intermediate layer 410 interposed therebetween. The first opposing surface 131 of the single crystal piezoelectric layer 130 and a first main surface 411 of the intermediate layer 410 are bonded to each other. The intermediate layer 410 is an intermediate layer made from $SiO_2$. Instead of $SiO_2$, the intermediate layer 410 may be made of any insulating material. For example, the intermediate layer 410 may be made of an organic material with electrical insulating properties and heat-insulating properties.

In the present preferred embodiment, an extended lower electrode 450 is provided between the intermediate layer 410 and the lower electrode layer 150. The extended lower electrode 450 is connected to the lower electrode layer 150 inside the first recess 132, and extended along the interface between the intermediate layer 410 and the single crystal piezoelectric layer 130. When viewed in the direction perpendicular to the first opposing surface 131, the extended lower electrode 450 is electrically connected to a second extended wire 470 through the hole 133 defined on the outer side with respect to the first recess 132.

In the piezoelectric device 400 according to the present preferred embodiment, the second opposing surface 151 of the lower electrode layer 150 opposing the first main surface 111 of the base 110 has surface roughness (Ra) greater than the surface roughness (Ra) of the first opposing surface 131 of the single crystal piezoelectric layer 130. Thus, if the second opposing surface 151 of the lower electrode layer 150 and the first main surface 411 of the intermediate layer 410 are bonded to each other, the bonding strength can be reduced. The piezoelectric device 400 with this structure can avoid having unstable excitation characteristics due to bonding of the second opposing surface 151 of the lower electrode layer 150 and the first main surface 411 of the intermediate layer 410 to each other. More specifically, the piezoelectric device 400 has stable excitation characteristics.

When the extended lower electrode 450 and the second extended wire 470 are connected to each other on the outer side with respect to the first recess 132 when viewed in the direction perpendicular to the first opposing surface 131, the portion of the laminated portion 420 above the first recess 132 is prevented from being bent toward the intermediate layer 410. This structure less easily allows the second opposing surface 151 of the lower electrode layer 150 and the first main surface 411 of the intermediate layer 410 to be bonded to each other. Thus, the piezoelectric device 400 has stable excitation characteristics.

Any two or more of the above preferred embodiments may be combined together as long as they are combinable.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A piezoelectric device, comprising:
a base that includes a first main surface and a second main surface opposed to the first main surface; and
a laminated portion that is laminated on the first main surface of the base; wherein
the laminated portion includes:
a single crystal piezoelectric layer; and
a pair of electrode layers that apply a voltage to the single crystal piezoelectric layer;
the single crystal piezoelectric layer includes a first recess in a first opposing surface that opposes the first main surface of the base;
the single crystal piezoelectric layer is bonded to the first main surface of the base at a portion of the first opposing surface other than the first recess;
a lower electrode layer defining at least a portion of the pair of electrode layers and extending over a surface of the single crystal piezoelectric layer opposing the base is at least partially located in the first recess;
a second opposing surface of the lower electrode layer opposing the first main surface of the base has a surface roughness greater than a surface roughness of the first opposing surface of the single crystal piezoelectric layer;
a plurality of upper electrode layers define at least a portion of the pair of electrode layers;
the plurality of the upper electrode layers are separated at a distance from each other, and at least a portion of the plurality of upper electrode layers is above the first recess; and
the lower electrode layer is positioned to at least partially oppose the plurality of the upper electrode layers with the single crystal piezoelectric layer interposed between the lower electrode layer and the plurality of upper electrode layers.

2. The piezoelectric device according to claim 1, wherein the surface roughness of the second opposing surface of the lower electrode layer is greater than or equal to about 0.5 nm and smaller than or equal to about 5.0 nm.

3. The piezoelectric device according to claim 1, wherein the lower electrode layer is located only in the first recess.

4. The piezoelectric device according to claim 1, wherein the lower electrode layer has a thickness smaller than or equal to a depth of the first recess.

5. The piezoelectric device according to claim 1, wherein
a second recess is defined in the first main surface of the base at a position opposing the first recess; and
the lower electrode layer includes an area that has a thickness greater than a depth of the first recess, and that is in contact with the base located in the second recess.

6. The piezoelectric device according to claim 1, wherein the first recess has a circular profile when viewed in a direction perpendicular to the first opposing surface.

7. The piezoelectric device according to claim 1, wherein the first recess is defined by an enclosed space located between the single crystal piezoelectric layer and the base.

8. The piezoelectric device according to claim 1, wherein a close contact layer is provided between the pair of electrode layers and the single crystal piezoelectric layer.

9. The piezoelectric device according to claim 1, further comprising first extended wires connected to the pair of electrode layers.

10. The piezoelectric device according to claim 5, wherein the first recess and the second recess together define an enclosed space located between the single crystal piezoelectric layer and the base.

11. The piezoelectric device according to claim 10, further comprising a hole defined in the single crystal piezoelectric layer at a position overlapping a portion of the lower electrode layer.

12. The piezoelectric device according to claim 5, further comprising:

at least one first extended wires and a second extended wire are connected to the pair of electrode layers.

13. The piezoelectric device according to claim 5, wherein the base includes a protrusion protruding from a bottom of the second recess.

14. The piezoelectric device according to claim 13, wherein a reinforcing lower electrode layer is positioned between the protrusion and the lower electrode layer.

15. The piezoelectric device according to claim 11, wherein the base includes a protrusion protruding from a bottom of the second recess, an entirety of an inside of the hole being overlapped by an upper surface of the protrusion.

16. The piezoelectric device according to claim 1, further comprising an intermediate layer between the base and the laminated portion.

17. The piezoelectric device according to claim 16, wherein an extended lower electrode is provided between the intermediate layer and the lower electrode layer.

* * * * *